United States Patent [19]

Killackey et al.

[11] Patent Number: 4,897,151
[45] Date of Patent: Jan. 30, 1990

[54] METHOD FOR FABRICATING A DICHROIC PARABOLIC LENS REFLECTOR

[75] Inventors: Henry T. Killackey, Covina; Joseph M. Gailliot, Jr., Alta Loma; John T. Branigan, Claremont, all of Calif.

[73] Assignee: General Dynamics Corp., Pomona Division, Pomona, Calif.

[21] Appl. No.: 224,617

[22] Filed: Jul. 27, 1988

[51] Int. Cl.[4] ............. C23F 1/02; B44C 1/22; C03C 15/00; C03C 25/06
[52] U.S. Cl. ................... 156/630; 156/634; 156/656; 156/659.1; 430/321; 430/323
[58] Field of Search ............. 156/629, 630, 631, 633, 156/634, 645, 656, 659.1, 664, 232, 666, 242, 245, 233, 150, 249, 151; 430/313, 318, 323, 321; 204/7, 19; 264/255, 264; 350/417, 442, 600; 427/162, 163

[56] References Cited

U.S. PATENT DOCUMENTS

| | | | |
|---|---|---|---|
| 2,135,873 | 11/1938 | Jones et al. | 204/07 |
| 2,305,050 | 12/1942 | Wise et al. | 204/07 |
| 2,734,243 | 2/1956 | Lips et al. | 22/193 |
| 2,765,248 | 10/1956 | Beech et al. | 154/110 |
| 3,378,469 | 4/1968 | Jochim | 204/7 |
| 3,428,533 | 2/1969 | Pichel | 204/7 |
| 3,577,323 | 5/1971 | Pichel | 204/07 |
| 3,839,129 | 10/1974 | Neumann | 161/4 |
| 3,893,877 | 11/1975 | Libman | 156/233 X |
| 3,910,806 | 10/1975 | Schwartz | 156/233 |
| 3,984,598 | 10/1976 | Sarazin et al. | 428/336 |
| 4,061,518 | 12/1977 | Burroughs et al. | 156/232 |
| 4,116,753 | 9/1978 | Tojyo | 156/629 |
| 4,188,358 | 2/1980 | Withoos et al. | 264/255 |
| 4,407,685 | 10/1983 | Hankland | 156/212 |
| 4,432,832 | 2/1984 | Fantone | 156/656 X |

Primary Examiner—William A. Powell
Attorney, Agent, or Firm—Neil F. Martin; Leo R. Carroll

[57] ABSTRACT

A method for making a metalized dichroic parabolic lens reflector for multi-frequency antenna system applications. The reflector is prepared by depositing an etchable conductive metallic layer upon a parabolic work surface of a male mandrel. The metallic layer is adhered to a parabolic support surface of a substrate formed of a low dielectric constant material. The mandrel is separated from the metallic with the metallic layer remaining bonded to the support surface. Photoresist imaging and chemical etching techniques are used to form a dipole grid pattern in the metallic layer.

17 Claims, 2 Drawing Sheets

METHOD FOR FABRICATING A DICHROIC PARABOLIC LENS REFLECTOR

BACKGROUND OF THE INVENTION

1. Field of the Invention

The present invention relates to dichroic antennas. More specifically, the present invention relates to a novel and improved technique for manufacturing frequency-selective surface antennas, particularly of the type having a frequency selective- surface formed on the reflecting surface of a parabolic lens reflector for dichroic antenna applications.

2. Description of the Related Art

In certain antenna designs, particularly in high frequency aerospace applications, it is desirable to fabricate high gain antennas which will receive signals of differing frequency bands. Antennas having a frequency-selective surface can provide the necessary high gain, multi-frequency capabilities that are often desired in microwave tracking and radar systems. One type of antenna utilizing the frequency-selective surface for multi-frequency applications is one that uses a dichroic parabolic reflector.

One particular type of dichroic antenna includes a parabolic reflector antenna mounted in front of a slotted array antenna. In this configuration the parabolic reflector antenna is designed to operate at higher frequencies than the slotted array antenna. The parabolic reflector antenna portion of the dichroic antenna includes a feed horn positioned at the focus of the parabolic reflector and associated waveguide and support structure. The parabolic reflector typically has a metalized surface upon which resonant dipoles, particularly cross dipoles, are formed therein. The parabolic reflector is usually formed from a flat substrate of low dielectric constant material which has a metalized front, or reflecting surface, in which dipoles are formed. The dipoles act as reflectors, particularly at frequencies within the resonant frequency band, while the structure acts transparent to lower frequencies. The dipole reflected signal is received by the feed horn positioned at the focal point of the parabolic reflector. Another type of dichroic antenna is disclosed in the article entitled "Frequency-Selective Surfaces For Multiple-Frequency Antennas," by G. H. Schennwm, *Microwave Journal* (May, 1973).

Attempts have been made at fabricating high performance dichroic antennas which utilize a parabolic lens reflector having dipole elements formed upon the parabolic reflector surface. Using prior known fabrication techniques, construction of a dichroic parabolic reflector have resulted in structures in which signals at frequencies outside of the dipole resonant frequency band are basically unaffected as they pass through the parabolic reflector structure. This characteristic greatly affects the overall performance of the antenna, especially the sensitivity of the lower frequency band antenna positioned behind the parabolic reflector antenna.

One technique for fabricating a parabolic reflector having a frequency-selective surface is by mounting upon a low dielectric constant foam body, a parabolic shaped substrate having a dipole grid pattern formed upon a front surface. The substrate is typically a sheet of low dielectric plastic or polyethylene material, such as a material sold under the trade name DUROID, having copper clad parallel planer front and back surface. The copper cladding is typically in the range of approximately 0.0010 to 0.0015 inch thick. The copper clad substrate is photoengraved to define, upon later etching, the desired dipole grid pattern in the front surface metallization. The substrate is restrained in a holding fixture, heated if necessary, and then pressed between matching male and female paraboloid shaped mandrels to give the substrate the desired parabolic shape.

After shaping, the back surface metallization is removed, typically by chemical etching techniques. Prior to etching the back surface, a protective layer may be applied to the front surface metallization to prevent chemical attack thereto. It is desired to leave the front surface metallization intact to enhance rigidity and shape retention of the formed substrate. However, in some cases the front surface metallization may be removed at the same time as the back surface metallization.

After etching, an adhesive material is then deposited upon the exposed back surface of the substrate. The substrate is then positioned for mounting the adhesive-backed substrate back surface upon a mating parabolic surface of a low dielectric constant foam body formed from a material such as polyurethane. One method for mounting the substrate upon the foam body is by stamping or pressure-forming the substrate upon the parabolic surface of the foam body. The adhesive is then cured to secure the substrate upon the foam body. The front surface is then chemically etched such that the desired dipole grid pattern is the only remaining metallization on the front surface.

Although fabrication by the just-described technique will achieve a functional parabolic reflector, use of such a reflector in a dichroic antenna can result in substantially less than optimal performance characteristics. For example, the use of a substrate for carrying the dipole grid pattern can itself provide attenuation of signals passing therethrough.

Another problem arises after the flat substrate has been formed into a parabolic shape. When the front surface metallization is etched leaving a dipole grid pattern. The once continuous metallization layer is therefor disrupted. With the metallization layer disrupted, the substrate tends to "pull back" a minute distance towards its original planar form. Even when the front surface etching occurs before the adherence to the foam backing, the substrate still tends to pull back into its original planar form. Another hindrance in achieving optimum antenna performance is a result of the defining of the individual dipole shapes. Defining the shape of the dipoles when the substrate is planar does not result in ideal dipole shapes for parabolic reflector form, especially for dipoles positioned adjacent the upper rim of the parabolic contour. In high frequency applications, such as in the millimeter wave frequency band and especially in the M frequency band, reflector parabolic shape and individual dipole shape become more critical than at lower frequencies. The "pulling back" of the substrate can disrupt the desired parabolic reflector shape. Furthermore, improperly shaped dipoles can seriously and adversely affect the antenna performance characteristics.

In the construction of parabolic lens reflectors, one commonly used material for the foam body is a material sold under the trademark ROHACELL. ROHACELL is a foam material having a low dielectric constant, typically in the range of approximately 1.05–1.15. Using a material with such a low dielectric constant minimally attenuates the portion of the signal outside of the dipole resonant frequency band as it passes through the parabolic lens reflector structure. However, foam bodies formed of ROHACELL and other types of low dielectric constant materials are typically of an insufficient stiffness to support direct dipole metallization in the required highly accurate parabolic contour. Various direct application techniques have been previously attempted but are undesirable because the required precise parabolic shape cannot be maintained.

Another method of forming reflective dipoles upon parabolic reflector surfaces utilizes direct transfer techniques. Some of these techniques, for example, utilize the transfer of a molded metal layer to a supporting base of some type. All of the transfer techniques use injected or flexible materials for either the transfer medium or the transferred to medium. The transfer techniques can affect the required precise parabolic surface curvature upon which the dipole grid pattern is formed.

It is, therefore, an object of the present invention to provide a novel and improved method for fabricating a parabolic lens reflector for implementing in a parabolic reflector antenna portion of a dichroic antenna.

It is yet another object of the present invention to provide a method for fabricating a dichroic parabolic lens reflector in which the fabrication methods are readily adapted to high volume manufacturing processes thus enabling production of highly reliable, accurate dichroic parabolic lens reflectors.

SUMMARY OF THE INVENTION

The present invention is a method for making a metalized dichroic parabolic lens reflector for multi-frequency antenna system applications. In one embodiment of the invention, a substrate is provided that is formed of a low dielectric constant material. The substrate has a preformed substantially parabolic support surface. A mandrel is provided having a work surface configured as a substantially reverse image of the support surface. A conductive layer, typically a metallic layer, is then formed upon the work surface. An adhesive layer is then deposited upon the conductive layer, or in the alternative, upon the support surface. The mandrel is mated with the substrate such that the conductive layer is adhered to the support surface by the adhesive layer. Pressure is applied to the substrate and mandrel to provide a void-free uniform thickness in the adhesive layer bonding the conductive layer to the support surface. The mandrel is then separated from the conductive layer. Upon separation of the mandrel from resonant dipoles is formed in the conductive layer.

BRIEF DESCRIPTION OF THE DRAWINGS

These and other features, objects and advantages of the present invention will become fully apparent from the detailed description set forth below when taken in conjunction with the drawings in which like reference characters identify correspondingly throughout and wherein.

DETAILED DESCRIPTION OF THE PREFERRED EMBODIMENTS

Figure 1:
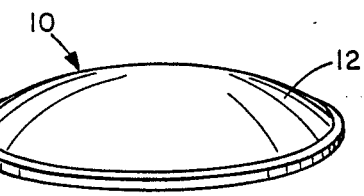
FIG. 1 illustrates a male mandrel having a parabolic work surface.

Referring now to the drawings, FIG. 1 illustrates a male mandrel 10 having a convex or parabolic outer surface 12. Surface 12 of mandrel 10 is typically formed by high accuracy milling or casting techniques. Using state-of-the-art computer controlled milling machines, a tolerance of 0.001 inch on the curved surface may be maintained. The curved parabolic surface 12 is then polished, using well known techniques, to achieve the desired resultant shape which may be characterized as having a smooth, highly accurate parabolic contour.

Mandrel 10 may be formed from various materials including metals and plastics. The preferred material from which mandrel 10 may be formed is polyoxy methalane, a material manufactured by DuPont Corporation and sold under the trademark DELRIN. Other materials from which mandrel 10 may be formed are metals, such as steel, or various other plastics such as polytetrafluoroethylene. It is desired that mandrel 10 be of such a material such that surface 12 is essentially a non-stick surface in the sense that a layer of metallization formed thereupon may be readily removed.

Figure 2:
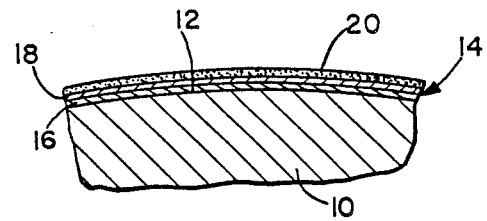
FIG. 2 is an enlarged sectional view of a portion of the mandrel after coating with a conductive metallic layer and an adhesive layer.

In the initial fabrication of the parabolic lens reflector of the present invention, a layer of conductive material, typically metal, is formed upon surface 12. In FIG. 2, metallic layer 14 is illustrated as being formed directly upon surface 12. Using a mandrel formed of polyoxy methalane it may be necessary to apply a wax-based release agent to surface 12 to enhance the release capabilities of metallic layer 14 formed thereupon. When using a mandrel formed of steel or various other materials, it may be necessary to plate and/or apply release agents to surface 12 prior to forming metallic layer 14 thereupon. Various metallic mandrel platings and release agents are well known in the art.

Metallic layer 14 may be formed upon surface 12 by various techniques. When using a mandrel formed of polyoxy methalane or other non-conductive plastic materials, metallic layer 14 is formed by first applying a silver layer 16 to surface 12. Silver layer 16 may be applied by chemical vapor deposition or sputtering techniques or, in the alternative, by spraying. It is preferred that silver layer 16 be as thin as possible and preferably approximately 20 microns in thickness. Silver layer 16 is used for the purpose of making surface 12 electrically conductive such that a further metallic layer may be electro-plated thereupon. A layer of electrolydic copper, layer 18, is typically electro-deposited by conventional electroplating techniques onto silver layer 16. The preferred overall thickness of conductive layer 14 is, in the range of 0.007–0.0014 inches.

In the alternative, it is envisioned that metallic layer 14 may be completely formed by applying a layer of electroless copper by chemical vapor deposition, sputtering or spraying. In another alternative method for forming layer 14, layer 16 may be formed from electroless copper that is be applied in 20 micron thickness. Layer 18 is formed upon layer 16 from electrolydic copper. Accordingly, an etchable conductive metallic layer 14 surface may be constructed without the need for a layer of silver. It is further envisioned that many various other materials and techniques may be utilized to form metallic layer 14.

When using a mandrel formed of steel or other electrically conductive material, it is unnecessary to apply a conductive layer, such as layer 16. Electrolydic copper may then be deposited directly upon surface 12. It is further envisioned that metallic layer 14 may be formed upon surface 12 as an integral layer by depositing electroless copper or other conductive material the preferred thickness range by chemical vapor deposition or sputtering processes.

Figure 3:
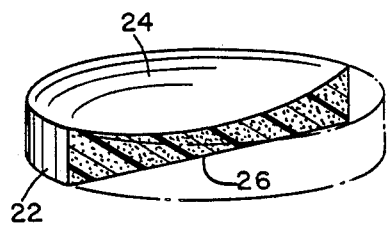
FIG. 3 is a cut-away perspective view of a foam body having a parabolic surface.

Upon completion of the deposition of metallic layer 14 upon surface 12, an adhesive layer 20 is applied as a thin even coating upon metallic layer 14. It is necessary that an adhesive be selected having high-strength bonding capabilities in addition to an inherent resistance to metallic etching chemicals. One such type of adhesive is a two-part epoxy adhesive that is well known in the art. The application of adhesive layer 20 upon metallic layer 14 is in preparation of bonding metallic layer 14 to a supporting substrate such as a low dielectric foam body 22 (FIG. 3). In the alternative, adhesive layer 20 may be applied to body 22 rather than metallic layer 14.

One such two-part epoxy that may be preferably used is manufactured by the Shell Corporation. The particular epoxy resin and curing agent are respectively sold under the trademark EPON RESIN 828, and EPON CURING AGENT U. The mixture of the resin and curing agent are respectively 100:25 parts by weight. The epoxy when cured has a dielectric constant of approximately 4.0.

Referring to FIG. 3, foam substrate or body 22 is illustrated with a diametric portion thereof cut away to reveal a front parabolic surface 24. For certain antenna applications, foam body 22 is generally cylindrical in nature, and typically having a preferably flat rear surface 26 opposite front parabolic surface 24. Foam body 22 is prepared by conventional computer controlled milling techniques, molding or by other techniques well known in the art so as to provide front surface 24 with a contour that is essentially a reverse image of mandrel surface 12. In the dichroic antenna applications, it is preferred that foam body 22 be fabricated of a material having a low dielectric constant. Such materials are the polymethacrylic imide rigid expanded plastics. Use of such materials assure adequate transparency with minimal attenuation to electromagnetic signals passing therethrough. One such type of foam material is the previously mentioned ROHACELL, and of particular ROHACELL 31 which typically has a dielectric constant of 1.05. It is further envisioned that other low dielectric constant foam materials may be utilized.

Figure 4:
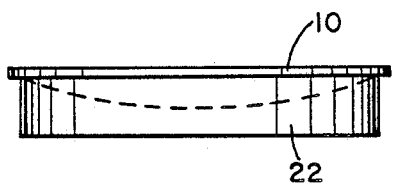
FIG. 4 illustrates the mandrel and the layers formed thereupon joined to the foam body.

FIG. 4 illustrates the application of adhesive-backed, metallic-layered mandrel surface 12 upon foam body 22. Mandrel surface 12 and foam body surface 24 are reverse parabolic images of one another. Therefore, metallic layer 14 of mandrel 10 is readily mounted upon foam body 22 at surface 24. Uniform pressure is then applied to one or both of foam body 22 and mandrel 10. The application of uniform pressure across foam body 22 and mandrel 10 forces a void-free, even distribution of the adhesive layer (adhesive layer 20 of FIG. 2) to a uniform thickness. Excess adhesive "oozes" about the periphery of the coupling of mandrel 10 and foam body 22 for removal. A uniform distribution of the adhesive layer provides minimal distortion of an electromagnetic signal passing though the adhesive layer and the foam body.

It is preferable that the final thickness of the adhesive layer be approximately 0.025 inches or less over the entire parabolic surface. An adhesive layer of even thickness within the preferred thickness range ensures reduced signal attenuation that results from the inherent nature of the epoxy since it has a higher dielectric constant than the foam body. An adhesive layer having voids or air pockets eliminated also removes the possibility of signal perturbation that would otherwise be caused by such voids or air pockets.

The epoxy layer is cured according to the technical specifications of the particularly epoxy used to ensure proper bonding of the metallic layer to the front surface of the foam body. For example, using the previously mentioned two-part epoxy, the epoxy curing is achieved at ambient temperature at a minimum of one hour. However, it is preferred that the epoxy be allowed to cure for a period of four hours and a temperature of 150 degrees Fahrenheit.

It is noted that although the epoxy acts as an excellent bonding agent, it has a secondary advantage over many various other bonding agents. Epoxy is a well known adhesive that has an inherent ability to withstand chemical attack when exposed to certain chemicals such as metal etching chemicals. This resistance to chemical attack is especially useful in a chemical etching of the metallic layer during later formation of the dipole grid pattern. The epoxy layer acts as a protective shield so as to prevent damage to the foam body from the etching chemicals. The harsh etching chemicals used to etch the dipole grid pattern in the metallic layer would, without protection from the adhesive layer, seriously compromise the highly accurate parabolic contour of the exposed parabolic surface 24 of foam body 22.

Figure 5A:
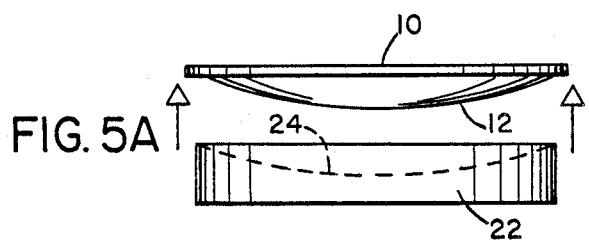
FIG. 5A illustrates the separation of the mandrel and the foam body with the adhesive layer bonding the metallic layer to the foam body.
Figure 5B:
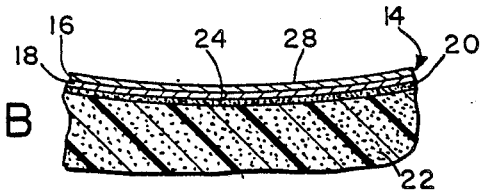
FIG. 5B is an enlarged sectional view of the foam body having the metallic layer bonded thereto by the adhesive layer.

FIGS. 5a and 5b illustrate mandrel 10 separated from foam body 22. FIG. 5a illustrates the act of physical separation of mandrel 10 from foam body 22. Upon separation, metallic layer 14 remains bonded to foam body 22 at surface 24 by adhesive layer 20. The adhesive layer 20 bonding force is greater than the force retaining metallic layer 14 upon mandrel surface 12. Mandrel 10 may be removed from the foam body bonded metallic layer by mechanical forces such as rotation, prying or air pressure techniques. Other techniques using temperature variations may be used to separate mandrel 10 from metallic layer 14.

FIG. 5b illustrates an enlarged sectional view of foam body 22 with metallic layer 14 adhered thereto at surface 24 by adhesive layer 20. Upon separation from mandrel 10, foam body 22 maintains its original parabolic shape and thus provides support to metallic layer 14 so as to also maintain the mandrel-formed parabolic shape of metallic layer 14. Once mandrel 10 is separated from metallic layer 14, a concave parabolic surface 28 of metallic layer 14 is exposed.

The previously described fabrication steps result in a parabolic metalized reflector layer mounted upon a foam body. This structure may in certain applications be used in conventional parabolic reflector antenna applications. However, for dichroic antenna applications, it is preferred that a crossed dipole grid pattern, although other patters may be utilized, be formed in the metalized reflector layer, i.e., metallic layer 14.

Figure 6:
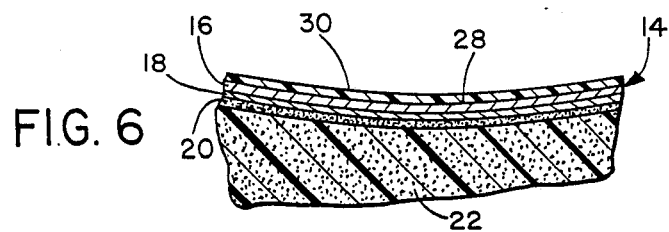
FIG. 6 is an enlarged sectional view of the foam body having a layer of photoresist material applied to the metallic layer.

Referring now to FIG. 6, a dipole grid pattern is formed in metallic layer 14 by using photoresist imaging and chemical etching techniques. A liquid photoresist layer 30 is formed upon surface 28 of metallic layer 14. One example of a liquid photoresist is one manufactured by the Kodak Corporation as the KODAK TYPE 3 liquid photoresist. Upon application, photoresist layer 30 is typically of a uniform thickness and preferably in the thickness range of 5,000–10,000 angstroms. One technique for achieving a required uniform thickness is by using a spinning technique. The photoresist is applied to surface 28 with the foam body and bonded metallic layer rotated at a predetermined speed. The rotation rate of the foam body is determined by the viscosity of the liquid photoresist, the desired thickness and the focal length of the parabolic reflector, for which the computation of rotation rate is well known in the art.

Although the preferred photoresist is a negative acting photoresist, it is envisioned that a positive photoresist may be used instead. Typically the photoresist is permitted to dry, such as by baking, prior to exposure of the dipole grid pattern. It is contemplated that although a liquid-based photoresist material is the most easily applied, other types of photoresists such as a film-type photoresist may be utilized. Film-type photoresists may be applied by vacuum forming or by shaping segments for placement upon surface 28 of the metallic layer 14.

The photoresist is then exposed and developed to realize a dipole grid pattern in metallic layer 14. Several techniques may be utilized in forming a photomask for exposure of the photoresist layer. One such technique is by contact printing of a photomask directly upon the photoresist surface. Another technique for exposing the photoresist layer is by utilizing a highly directive light source which exposes specified areas of the photoresist layer without the need of a photomask. However, the preferred method of exposing the desired dipole grid pattern is by utilizing an "off contact" printing technique.

Figure 7:
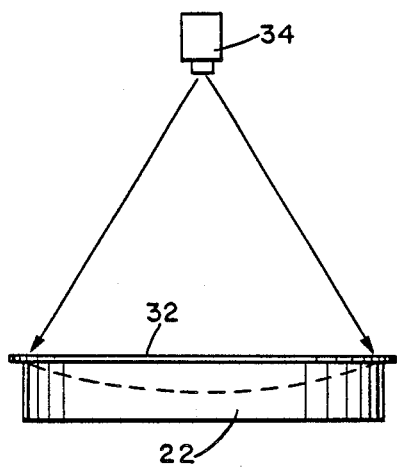
FIG. 7 illustrates the exposure of the dipole pattern in the photoresist.

FIG. 7 illustrates the application of the off-contact printing technique using a negative acting photoresist and a negative photomask 32. Photomask 32 is typically a negative chromium glass plate bearing the desired dipole grid pattern artwork on a surface. Photomask 32 is placed upon the rim of foam body 22 with the artwork facing photoresist layer 30.

The photoresist layer is then exposed to yield a positive dipole image in the photoresist layer when using a negative artwork and negative acting photoresist. Utilizing the "off contact" printing technique, an infinite light source 34, such as a collimated light projector, is placed facing photomask 32. Light source 34 projects light through photomask 32 upon photoresist layer 30 (FIG. 6). For example, a Ka band parabolic lens reflector was constructed using a collimated beam of light. In this particular application a collimated beam of light was generated by a light projector and lens arrangement. The projector used a 400 watt bulb and was placed approximately 20 feet from photomask 32. The photoresist layer was exposed for approximately 1 hour and 45 minutes.

Although the previously mentioned types of exposure techniques such as contact printing or direct photo plotting are available, the preferred technique is the "off contact" printing technique. It is known that the dipole grid pattern formed in a flat plane metallization layer is somewhat different from those formed in parabolic metallization layer. In the parabolic metallization layer, cross dipoles must be formed somewhat elongated in their planar dimension, i.e. length and width depending upon their position along the parabolic surface, from the center to the rim, to achieve optimum performance. The centrally located dipoles are imaged in essentially a flat plane while those extending along the curvature toward the rim of the parabolic surface increase in elongation. Using contact printing methods, without compensating for dipole elongation, each dipole would be of the same size and shape. Accordingly, dipoles of the same size focus upon the parabola focal point rather than looking outwardly towards infinity. With the dipoles looking at the focal point, a resultant degradation in performance occurs. However, it is envisioned that by careful definition of the elongation of individual dipoles as their size changes with position along the curvature, properly sized and shaped dipoles may be realized by contact printing techniques. Similarly, using direct photo-plotting techniques also requires compensation of the dipole size and shape along the curvature of the parabolic surface in order to achieve optimal performance.

Upon the exposure of the dipole grid pattern in photoresist layer 30, the light unexposed portion of photoresist layer 30 is then removed using an organic solvent. In a negative imaging process, upon development and removal of the unexposed photoresist, the remaining exposed photoresist forms a positive dipole image upon the surface of metallic layer 14. The unexposed photoresist is removed using inorganic solvents commonly used for unexposed photoresist removal purposes. Thus, the unexposed portions of photoresist layer 30 as removed expose portions of metallic layer 14.

The exposed portions of metallic layer 14 are then removed by chemical etching to form the desired dipole grid pattern. In the embodiment wherein metallic layer 14 includes silver layer 16, the exposed portions of silver layer 16 are first removed. However, the portions of silver layer 16 covered by the exposed photoresist are protected from chemical etching by the exposed photoresist remaining thereupon. Typically, silver layer 16 is chemically etched using one of the many well known silver etching chemicals, one preferred silver etching chemical being a solution of chromium trioxide. Silver layer 16 is immersed in a bath of the chemical etching solution or sprayed with the chemical etching solution. Due to the harsh nature of chemical etching solutions, these solutions can chemically attack foam body 22. Therefore, care must be taken to avoid any of the chemical etching solution to contact any portion of the foam body 22. Etch time is approximately 1 minute with the chemical etching solution at ambient temperature. The metallic layer is then rinsed with water to remove the etching solution and dissolved silver. Upon etching of the silver layer 16, underlying copper layer 18 is exposed.

Exposed copper layer 18 is then etched with a solution of ferric chloride. Again the exposed photoresist remaining upon silver layer 16 protects the underlying metallization from chemical attack. The etching of the exposed portions of copper layer 18 is achieved by spraying or immersing the layer in a bath of the chemical etching solution. Etch time is approximately 2 minutes with the chemical etching solution at a temperature of 100 degrees Fahrenheit. Upon completion of the etching, the etching solution and copper is then rinsed away with water. During etching of the copper, none of the ferric chloride solution should contact the foam body 22 so as to prevent adverse chemical attack thereto. It is preferred that the chemical etch rate be set at a rate to prevent undercut etching of photoresist-covered dipole pattern metallization. Since adhesive layer 20 remains upon surface 24 of foam body 22, chemical attack to foam body 22 at surface 24 is prevented where metallic layer 14 is removed. Adhesive layer 20 also continues to bond the individual formed dipoles to the precise parabolic contour of foam body surface 24.

Figure 8:
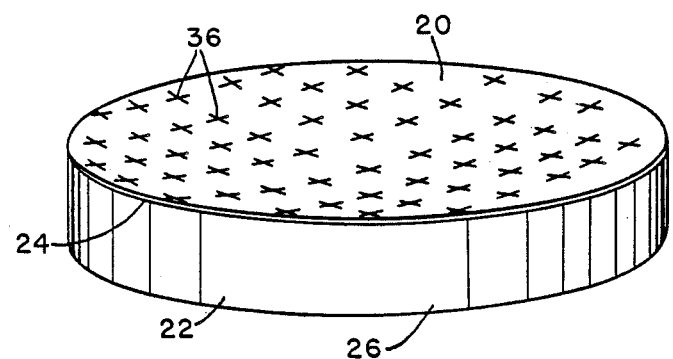
FIG. 8 illustrates the resultant parabolic lens reflector upon etching of the metallic layer to form a resonant dipole pattern therein.

FIG. 8 illustrates the completed parabolic lens reflector. Foam body 22 has formed upon surface 24 adhesive layer 20. A dipole grid pattern formed of individual stress-free dipoles 36, formed from the original metallic layer 14, bonded by adhesive layer 20 to surface 24. The exposed photoresist remaining upon the dipoles may then be removed. In certain cases the photoresist may be left upon the individual dipoles to provide a protective layer or coating. This remaining photoresist has no significant effect on the electrical performance of the parabolic lens reflector.

Utilizing the just described techniques many variations in steps in forming the dipole grid elements upon the foam body may be realized. Using the above techniques, parabolic antennas were constructed in both the M and Ka frequency bands. In the constructed models the diameter of foam body 22 is approximately 9 inches with the parabolic surface 24 having a focus of 3 inches from the base of the parabolic surface. It is envisioned that other sizes in the foam body may be readily constructed using the teachings of the present invention. In addition, various other frequency band resonant dipoles may be constructed using the just described techniques for various frequency ranges.

Fabrication of a dichroic parabolic lens reflector using these techniques results in significant improvement in the ability for out of band signals to pass through the reflector structure.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiment shown herein, but is to be accorded the widest scope consistent with the principles and novel features disclosed herein.

We claim:

1. A method for forming a dichroic lens reflector comprising the steps of:
   providing a substrate formed of a low dielectric constant material, said substrate having a pre-formed substantially parabolic support surface;
   providing a mandrel having a work surface formed as a substantially reverse image of said support surface;
   forming a conductive layer upon said work surface;
   mounting said conductive layer upon said support surface;
   removing said mandrel from said conductive layer; and
   forming an array of dipoles in said conductive layer.

2. The method of claim 1 wherein the forming of said conduction layer comprises the step of depositing a layer of copper upon said work surface.

3. The method of claim 1 wherein the forming of said conductive layer comprises the steps of:
   depositing a layer of silver upon said work surface; and
   depositing a layer of copper upon said silver layer.

4. The method of claim 1 wherein said mounting of said conductive layer upon said support surface comprises the steps of:
   forming an adhesive layer upon said conductive layer; and
   mating said mandrel conductive layer with said substrate with said adhesive layer bonding said conductive layer to said support surface.

5. The method of claim 1 wherein said forming of dipoles in said conductive layer comprises the steps of:
   applying a layer of photoresist material upon said conductive layer;
   exposing predetermined portions of said photoresist layer to light;
   developing said photoresist layer so as to remove said light unexposed portions of said photoresist layer and reveal corresponding portions of said conductive layer; and
   removing said revealed conductive layer portions.

6. The method of claim 5 wherein said step of exposing portions of said photoresist layer comprises the steps of:
   placing a planar mask, having predetermined transparent and opaque patterns formed therein, adjacent said substrate facing said photoresist layer; and
   providing a beam of collimated light to said mask.

7. The method of claim 5 wherein said said step of exposing portions of said photoresist layer comprises the steps of:
   providing a beam of light;
   directing said beam of light at said predetermined portions of said photoresist layer.

8. The method of claim 1 wherein said forming of dipoles in said conductive layer comprises the steps of:
   applying a layer of photoresist material upon said conductive layer;
   exposing predetermined portions of said photoresist layer to light;
   developing said photoresist layer so as to remove said light exposed portions of said photoresist layer and reveal corresponding portions of said conductive layer; and
   removing said revealed conductive layer portions.

9. The method of claim 8 wherein said step of exposing portions of said photoresist layer comprises the steps of:
   placing a planar mask, having predetermined transparent and opaque patterns formed therein, adjacent said substrate facing said photoresist layer; and
   providing a beam of colimated light to said mask.

10. The method of claim 8 wherein said said step of exposing portions of said photoresist layer comprises the steps of:
    providing a beam of light;

directing said beam of light at said predetermined portions of said photoresist layer.

11. A method for forming a dichroic parabolic lens reflector comprising the steps of:
providing a mandrel having a convex parabolic work surface;
providing a substrate formed of a low dielectric constant foam material and having a concave parabolic support surface, said work surface and said support surface being substantially reverse images of one another;
forming a conductive metallic layer upon said work surface;
forming an adhesive layer upon said conductive layer;
mating said mandrel with said substrate, said adhesive layer contacting said support surface;
separating said mandrel from said metallic layer, said metallic layers bonded to said support surface by said adhesive layer; and
forming a predetermined grid pattern of resonant dipoles in said conductive layer.

12. The method of claim 11 wherein the forming of said conduction layer comprises the step of depositing a layer of copper upon said work surface.

13. The method of claim 11 wherein the forming of said conductive layer comprises the steps of:
depositing a layer of silver upon said work surface; and
depositing a layer of copper upon said silver layer.

14. The method of claim 11 wherein said mating of said mandrel with said substrate comprises the steps of:
positioning said work surface adjacent to and facing said support surface;
contacting said adhesive layer with said support surface; and
applying pressure to said mandrel and said substrate so as to achieve uniform thickness in said adhesive layer with said metallic layer substantially uniformly spaced from said support surface.

15. The method of claim 14 wherein said forming of dipoles in said metallic layer comprises the steps of:
applying a layer of photoresist material upon said metallic layer;
exposing predetermined portions of said photoresist layer to light;
developing said photoresist layer so as to remove light unexposed portions of said photoresist layer and reveal corresponding portions of said metallic layer;
removing said revealed metallic layer portions.

16. The method of claim 15 wherein said step of exposing portions of said photoresist layer comprises the steps of:
placing a planar mask having predetermined transparent and opaque patterns formed therein, adjacent said substrate facing said photoresist layer;
providing a beam of collimated light to said mask.

17. The method of claim 15 wherein said removing of said revealed conductive layer portions comprises the step of chemically etching said revealed metallic layer portions.

* * * * *